(12) United States Patent
Wen

(10) Patent No.: US 6,187,638 B1
(45) Date of Patent: Feb. 13, 2001

(54) METHOD FOR MANUFACTURING MEMORY CELL WITH INCREASED THRESHOLD VOLTAGE ACCURACY

(75) Inventor: Wen-Ying Wen, Hsinchu (TW)

(73) Assignee: Winbond Electronic Corp., Hsinchu (TW)

( * ) Notice: Under 35 U.S.C. 154(b), the term of this patent shall be extended for 0 days.

(21) Appl. No.: 09/205,704

(22) Filed: Dec. 4, 1998

(30) Foreign Application Priority Data

Jun. 8, 1998 (TW) ................................. 87109110

(51) Int. Cl.⁷ ................................. H01L 21/8236
(52) U.S. Cl. ................................. 438/278; 438/276
(58) Field of Search ................................. 438/275, 276, 438/277, 278

(56) References Cited

U.S. PATENT DOCUMENTS 5,514,610 * 5/1996 Wann et al. ................. 257/390
5,545,580 * 8/1996 Sheng et al. ................. 438/276
5,576,236 * 11/1996 Chang et al. ................. 438/278
5,585,297 * 12/1996 Sheng et al. ................. 438/278

* cited by examiner

Primary Examiner—Charles Bowers
Assistant Examiner—Jack Chen
(74) Attorney, Agent, or Firm—Rosenberg, Klein & Lee

(57) ABSTRACT

A method is provided for manufacturing a memory cell with a increased threshold voltage accuracy. The memory cell has a substrate including a plurality of first conducting lines in a first direction and a plurality of second conducting lines in a second direction. The method includes the steps of forming a photoresist layer over the first and the second conducting lines, forming a window on the photoresist layer to expose a portion of the second conducting lines, thinning the portion of the second conducting lines in the windows, and doping impurities into the substrate between two of the first conducting lines to form the memory cell.

21 Claims, 6 Drawing Sheets

METHOD FOR MANUFACTURING MEMORY CELL WITH INCREASED THRESHOLD VOLTAGE ACCURACY

FIELD OF THE INVENTION

The present invention relates to a method for manufacturing a memory cell with a increased threshold voltage accuracy, and more particularly to a method for manufacturing a memory cell in a multi-level mask read-only-memory (ROM) with a increased threshold voltage accuracy.

BACKGROUND OF THE INVENTION

Nowadays, the read-only-memory (ROM) has been used in all kinds of digital products because it can save data permanently as the power is turned off, and has an only-read function without needing random-access program code, such as the basic-input-output-system (BIOS) in a personal computer.

Please refer to FIG. 1(a) which is a top view of a structure of a mask ROM with a conventional flat cell. The bit line 10 is disposed along the first direction 101 and is composed of a buried layer structure. A gate conducting layer formed by a tungsten silicide (WSix) layer 111 and a polysilicon layer 112 is formed along the second direction 102 to serve as a word line 11. Please refer to FIG. 1(b) and FIG. 1(c) which are sectional views of a mask ROM, taken along line A–A' and line B–B' respectively. There is a gate oxide layer 13 formed between the substrate 12 and the polysilicon layer 112, and a photoresist layer 14 is deposited over the mask ROM. The photoresist layer 14 is patterned by photolithography to define the code implantation area 15 and then impurities are doped into the substrate 12 by an ion implantation process for threshold voltage adjustments.

In an ordinary two-level mask ROM for saving binary digital data, the ion implantation process is performed once to distinguish two different threshold voltages (have and haven't been ion implanted in MOS). However, in order to increase the accumulation density in a memory device, the multi-level mask ROM is developed for storing more data in the same device number and same area of MOS. The multi-level mask ROM is made by executing the ion implantation process several times to distinguish the different threshold voltages. Please refer to FIG. 1(b) and FIG. 1(c). By implanting different ion concentration in different code implantation areas, different areas with different threshold voltages are formed. For example, a three-level mask ROM, formed by two times of ion implantation process, has three different areas with three different implantation concentration. Thus, the multi-level logic in a memory cell can fully utilize the device area and save more data without increasing the device number.

However, in conventional processes, ions must be implanted through a thick gate conducting layer 11 which is formed by a WSix layer 111 and a polysilicon layer 112. The thickness of the WSix layer is ranged from 1000 Å to 1500 Å and so is the polysilicon layer. Therefore, high energy is needed for doping impurities into the substrate 12. The more the energy is needed to penetrate the gate conducting layer, the more serious the ion scattering effect and the ion concentration variation will be. This serious ion concentration variation makes the threshold voltage of the ion implantation area imprecise. The threshold voltage distribution is in the form of Guass distribution as shown in FIG. 2. The ion scattering effect causes the threshold voltage overlap. In a multi-level mask ROM, the problem of the overlap is especially serious. To avoid the overlap, the spaces between each threshold voltage should be increased but the number of the threshold voltage will be limited. In other words, the multi-level mask ROM can not save too many data by the applicant. The present invention is tried to deal with the above situation encountered by the prior art.

SUMMARY OF THE INVENTION

An object of the present invention is to provide a method for manufacturing a memory cell, wherein the memory cell with a increased threshold voltage accuracy, has a substrate forming thereon a plurality of first conducting lines in a first direction forming thereon a plurality of second conducting lines in a second direction.

According to the present invention, first of all, a photoresist layer is formed over the first and the second conducting lines. Subsequently, a window is formed on the photoresist layer to expose a portion of the second conducting lines, and the portion of the second conducting lines in the window is thinned. Thereafter, impurities are doped into the substrate between two of the first conducting lines to form the memory cell.

Conventionally, the conducting layer is thick and the doping energy has to be high. Because the high energy can cause a serious ion scattering effect, the threshold voltage is easy to overlap. This problem will make the threshold voltage imprecise. In the present invention, the conducting layer is thinned. Therefore, the energy for doping impurities and the ion scattering effect are lowered to obtain a high threshold voltage accuracy.

In accordance with one aspect of the present invention, before the photoresist layer is formed, the method further includes the steps of forming an dielectric layer over the first and the second conducting lines, and removing a portion of the dielectric layer to expose the second conducting lines.

In an embodiment of the present invention, the dielectric layer is formed by a high density plasma chemical vapor deposition (HDPCVD) process or a plasma enhanced chemical vapor deposition (PECVD) process. The portion of the dielectric layer is removed by an etch back process or a chemical mechanical polishing (CMP) process and the portion of the second conducting lines are thinned by a reactive ion etching.

The present invention may best be understood through the following description with reference to the accompanying drawings, in which:

DETAILED DESCRIPTION OF THE PREFERRED EMBODIMENTS

Figure 1A:
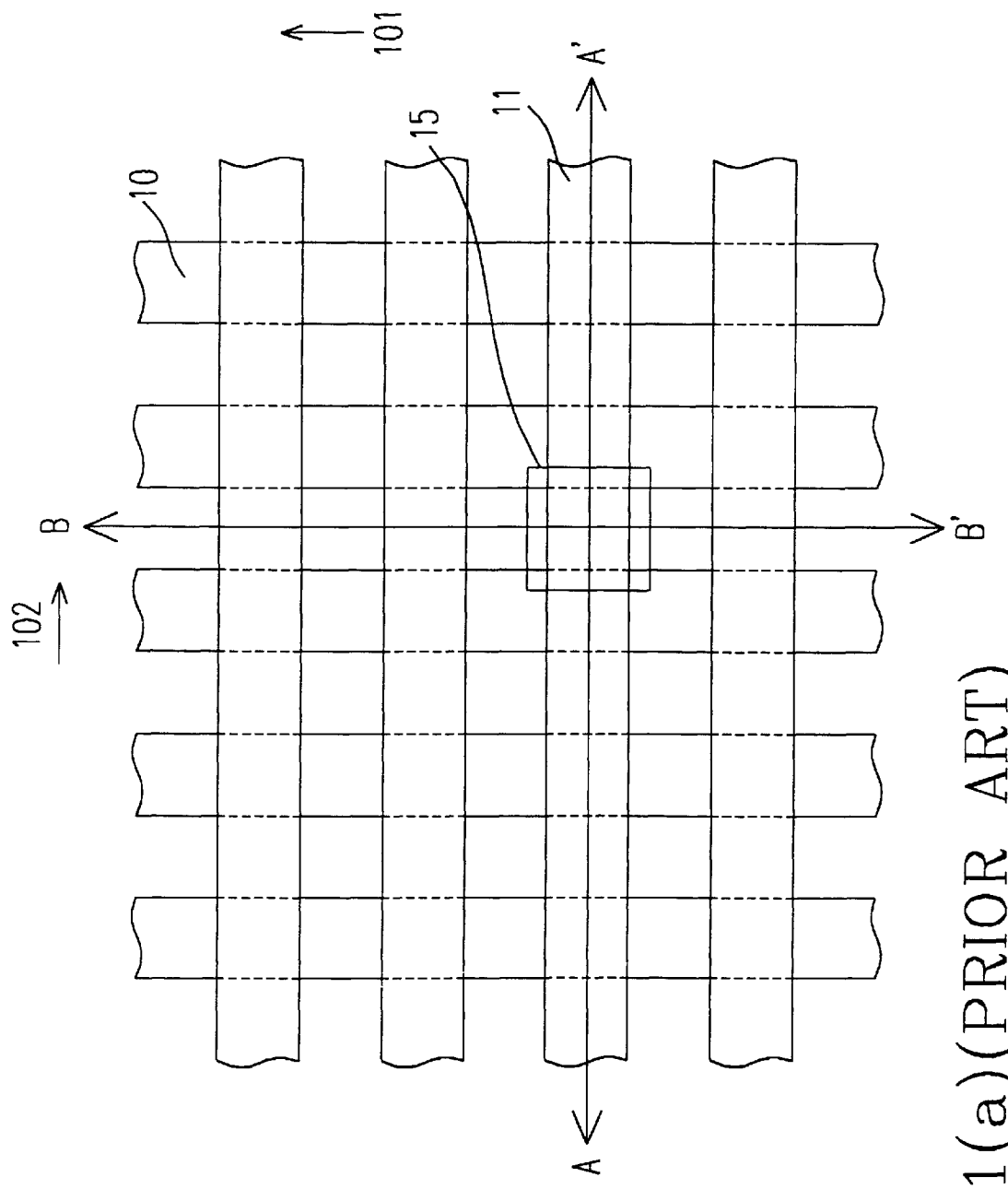
FIG. 1(a) is a schematic diagram showing a top view of a conventional memory cell.
Figure 1B:
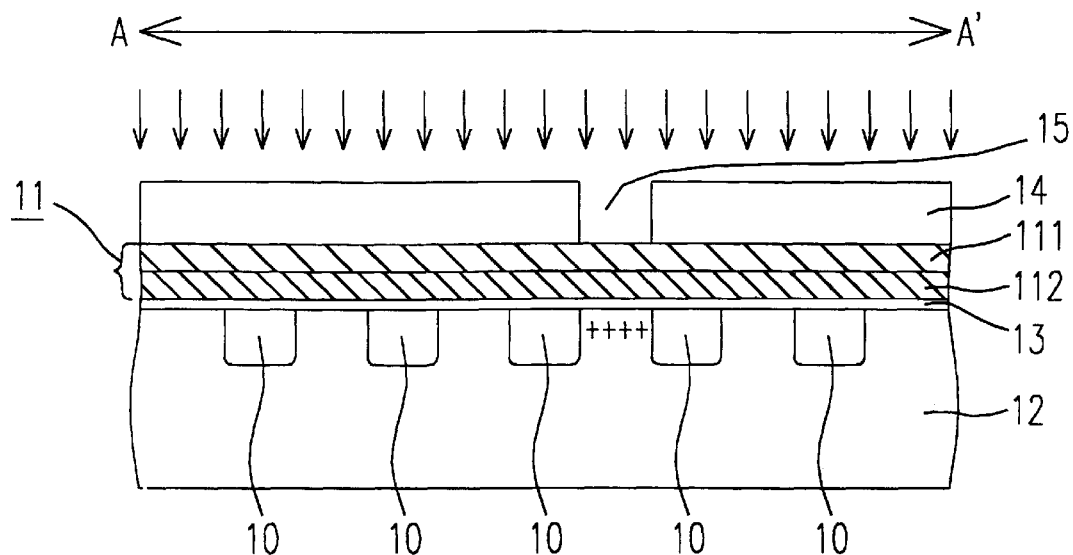
FIGS. 1(b) and (c) are sectional views of a conventional memory cell of FIG. 1(a), taken along line A–A' and line B–B' respectively.
Figure 1C:
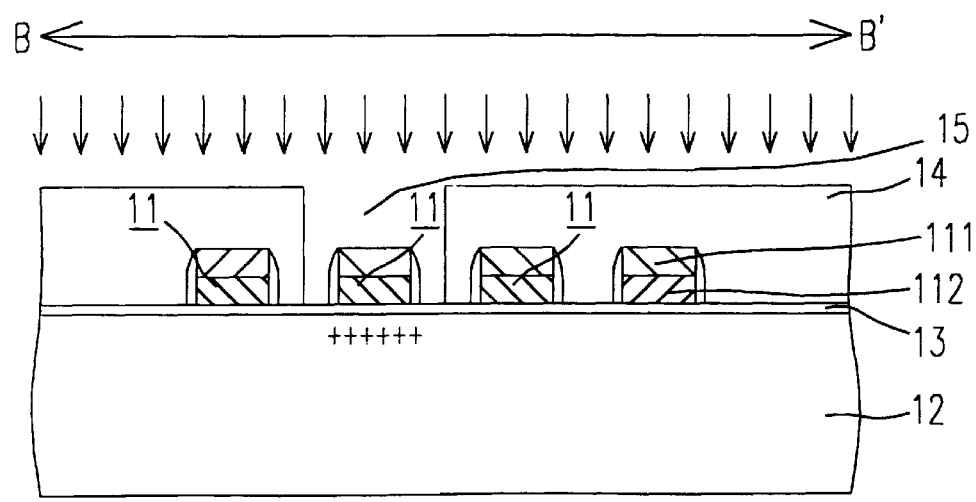
Figure 2:
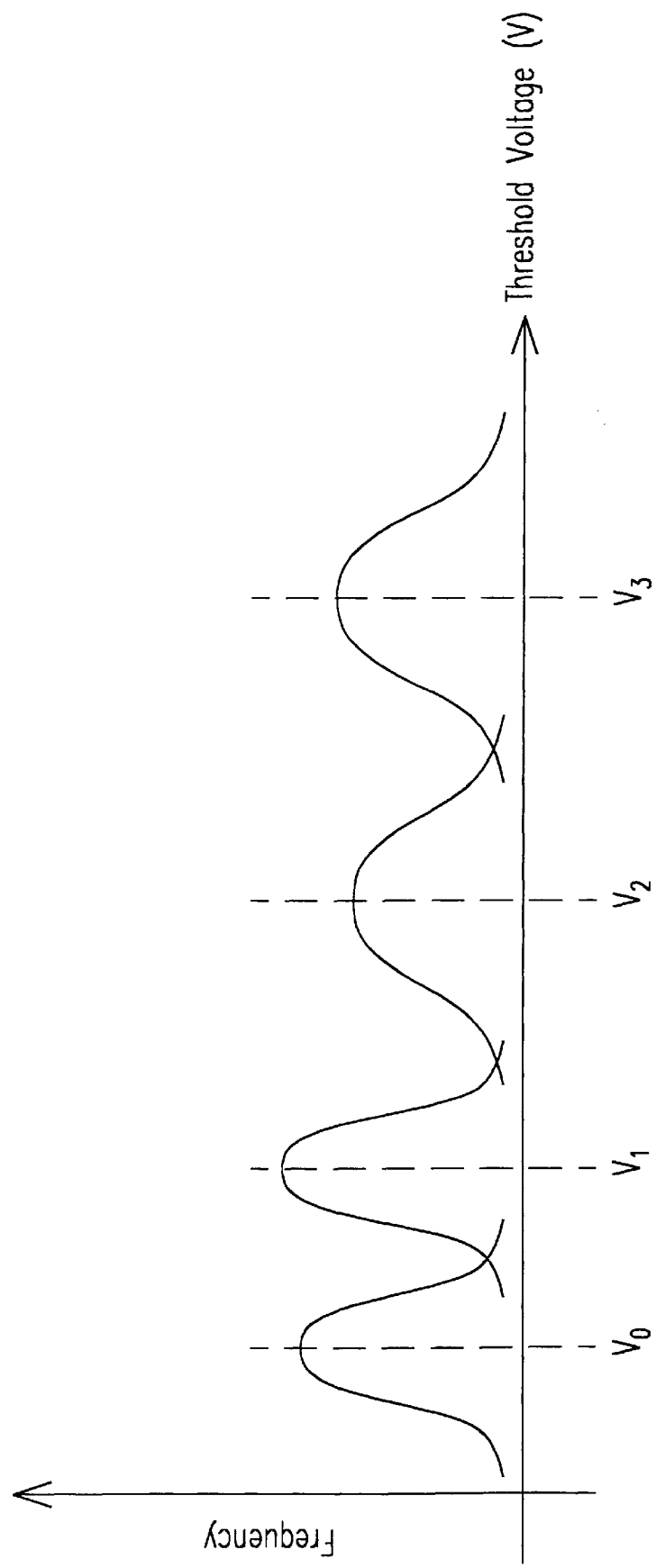
FIG. 2 is a schematic diagram showing an ion scattering effect of a memory cell.

FIGS. 3(a)~(e) show a preferred embodiment of a method for manufacturing a memory cell, especially for manufacturing a memory cell of a multi-level mask read-only memory (ROM), according to the present invention. Please refer to FIG. 3(a) which is a diagram showing a top view of a flat cell. The bit lines 30 with a buried layer structure are formed along the first direction 301 and a gate conducting layer, constructed by a tungsten suicide (WSix) layer 311 and a polysilicon layer 312, is formed along the second direction 302. To prevent the substrate from being etched by the subsequent etching process and forming a trench thereon, a dielectric layer 32 is filled between any two of the gate conducting layers 31. The dielectric layer 32 is formed by a high density plasma chemical vapor deposition (HDPCVD) process or a plasma enhanced chemical vapor deposition (PECVD), and is etched for exposing the gate conducting layer 31 by an etch back or a chemical mechanical polishing (CMP) process.

Figure 3A:
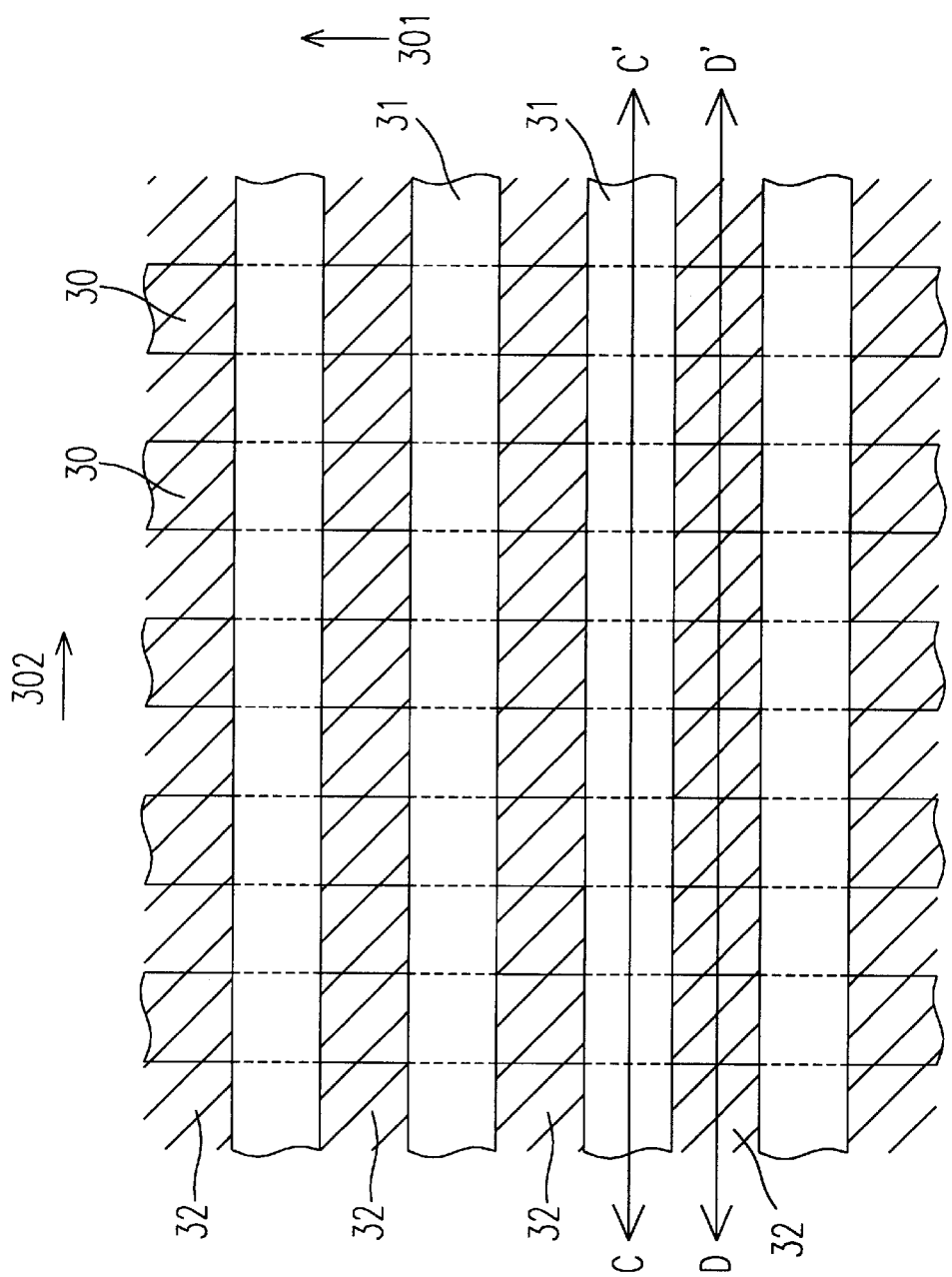
FIGS. 3(a)~(e) schematically show a preferred embodiment of a method for manufacturing a memory cell according to the present invention.
Figure 3B:
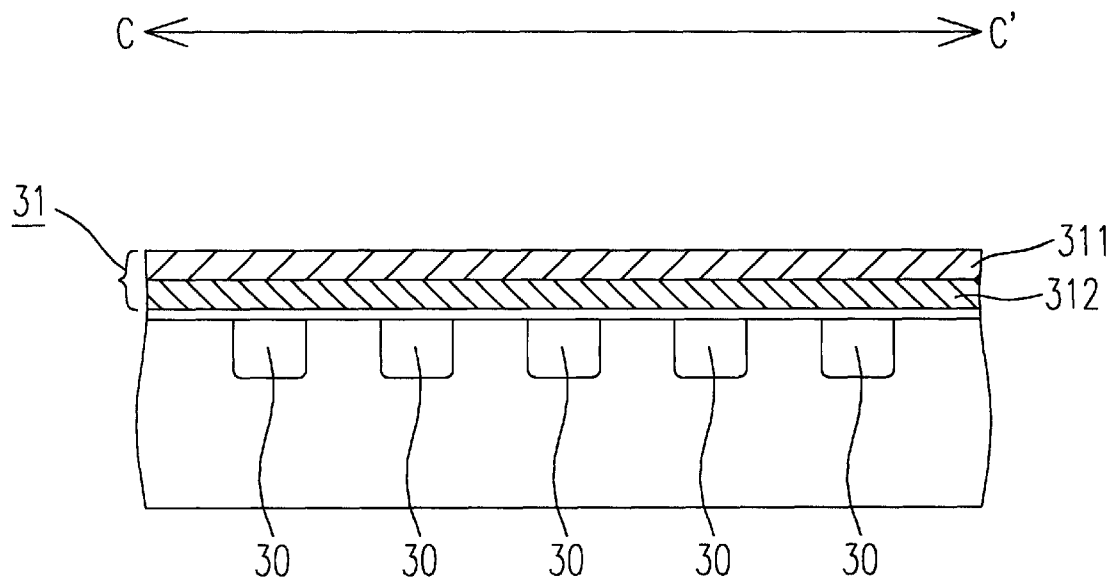
Figure 3C:
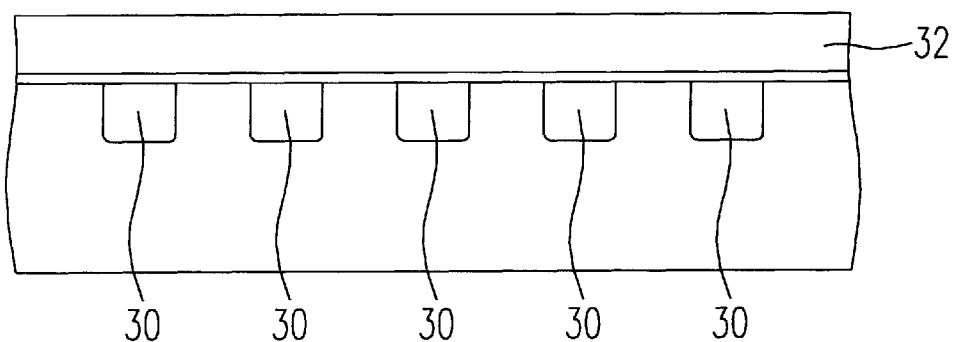

Please refer to FIGS. 3(b) and (c) which are sectional views of the flat cell in FIG. 3(a), taken along line C–C' and line D–D' respectively. FIG. 3 (b) shows that the gate conducting layer 31 is formed along direction 302 and is constructed by a tungsten silicide (WSix) layer 311 and a polysilicon layer 312. FIG. 3(c) shows the step of filling the dielectric layer 32 between the gate conducting layers 31.

Figure 3D:
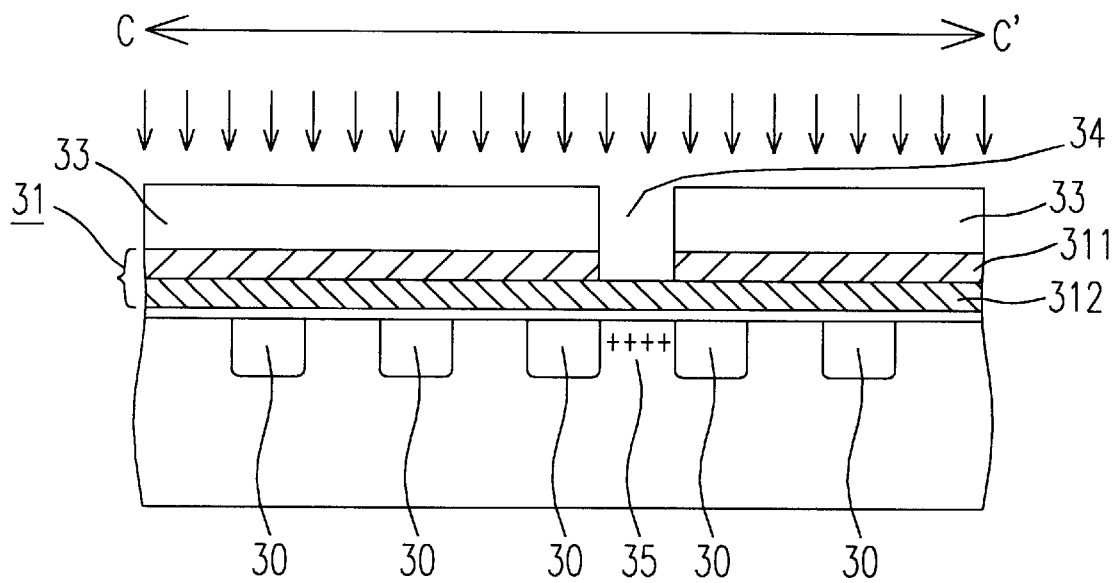
Figure 3E:
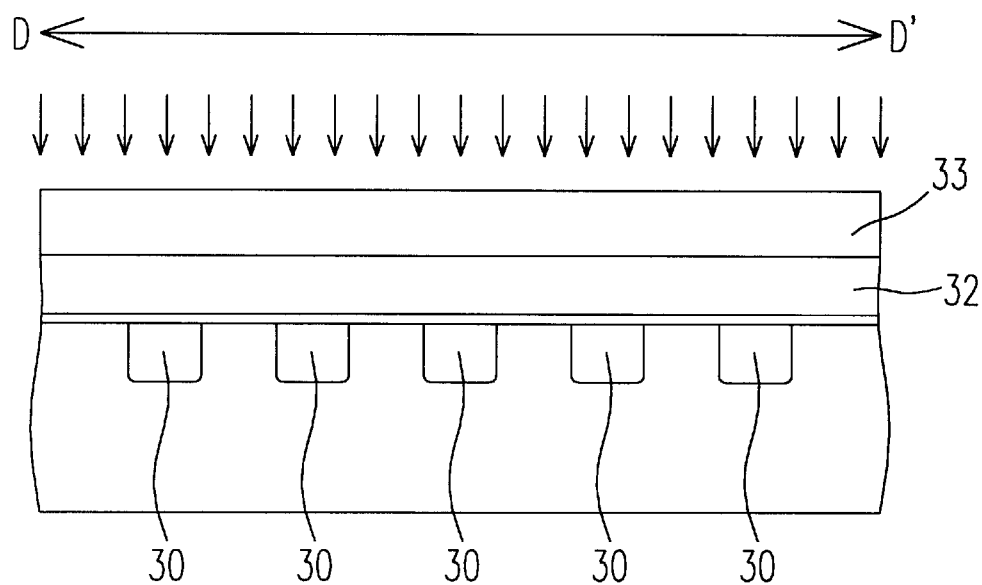

Please refer to FIGS. 3(d) and (e) showing an ion implantation process. First of all, a photoresist layer 33 is formed over the cell and is then patterned by photolithography to define the window 34. After a certain dose of ions is implanted into the substrate 35, the photoresist layer 33 is removed and a flat cell is produced in a multi-level mask ROM by repeating the above process.

However, conventionally the gate conducting layer is too thick. The overlap of ions, induced by the high implantation energy, is a serious problem. This problem results in the inaccuracy of the threshold voltage. According to the present invention, the gate conducting layer 31 is etched by an reactive ion etching process before doping ions into the substrate 35. The etched thickness can be differed, depending on different needs. For example, the etching process can be stopped after etching out the tungsten silicide layer 311 or overetching a part of polysilicon layer 312. (The best etching condition is to leave the thickness of the polysilicon layer 312 ranged from 500 Å to 1000 Å.) After thinning the gate conducting layer 31, ions are doped into the substrate through the window by an ion implantation process. Because the thickness of the gate conducting layer is reduced, the implantation energy and the ion scattering effect is lowered.

The above process can also be applied to a memory cell of a conventional mask ROM which has a field oxide layer. Therefore, the deposition and etching processes of the dielectric layer are not required for the present invention. The window can be defined and the gate conducting layer can be etched directly. Thereafter, ions are doped into the substrate by a lower implantation energy.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a memory cell, with increased accuracy in a threshold voltage thereof, having a substrate, forming thereon a plurality of first conducting lines in a first direction, forming thereon a plurality of second conducting lines in a second direction, comprising steps of:

forming a dielectric layer over said first and said second conducting lines;

removing a portion of said dielectric layer to expose said second conducting lines;

forming a photoresist layer over said first and said second conducting lines;

forming a window on said photoresist layer to expose a portion of said second conducting lines;

thinning said portion of said second conducting lines in said window; and doping impurities into said substrate between two of said first conducting lines for a threshold voltage adjustment to form said memory cell.

2. The method according to claim 1 wherein said dielectric layer is an oxide layer.

3. The method according to claim 1 wherein said dielectric layer is formed by a high density plasma chemical vapor deposition (HDPCVD) process.

4. The method according to claim 1 wherein said dielectric layer is formed by a plasma enhanced chemical vapor deposition (PECVD) process.

5. The method according to claim 1 wherein said portion of said dielectric layer is removed by an etch back process.

6. The method according to claim 1 wherein said portion of said dielectric layer is removed by a chemical mechanical polishing (CMP) process.

7. The method according to claim 1 wherein said memory cell is a flat cell in a multi-level mask read-only-memory (ROM).

8. The method according to claim 1 wherein said first conducting lines are bit lines with a buried layer structure.

9. The method according to claim 1 wherein said second conducting lines are word lines.

10. The method according to claim 1 wherein each of said second conducting lines comprises a polysilicon layer, forming thereon a tungsten silicide ($WSi_x$) layer.

11. The method according to claim 10 wherein said portion of said second conducting lines are thinned by a reactive ion etching.

12. The method according to claim 11 wherein said reactive ion etching is stopped when an exposed portion of said $WSi_x$ layer is etched out.

13. The method according to claim 11 wherein said reactive ion etching is stopped when a remained portion of said polysilicon layer has a thickness ranged from 500 Å to 1000 Å.

14. The method according to claim 1 wherein said substrate is doped with impurities by an ion implantation process.

15. The method according to claim 1 wherein said method further comprises a step of repeating said threshold voltage adjustment to manufacture a multi-level mask ROM.

16. A method for manufacturing a memory cell, with increased accuracy in a threshold voltage thereof, having a substrate, formed thereon a plurality of first conducting lines in a first direction, forming thereon a plurality of second conducting lines in a second direction, comprising steps of:

forming a dielectric layer over said first conducting lines and between any two of said second conducting lines;

forming a photoresist layer over said first and said second conducting lines;

forming a window on said photoresist layer to expose a portion of said second conducting lines;

thinning said portion of said second conducting lines in said window; and doping impurities into said substrate between two of said first conducting lines for a threshold voltage adjustment to form said memory cell.

17. The method according to claim 16 wherein said memory cell is a flat cell in a multi-level mask read-only-memory (ROM).

18. The method according to claim 16 wherein each of said second conducting lines comprises a polysilicon layer, forming thereon a tungsten silicide ($WSi_x$) layer.

19. The method according to claim 16 wherein said portion of said second conducting lines are thinned by a reactive ion etching.

20. A method for manufacturing a memory cell having a substrate, forming thereon a plurality of first conducting lines in a first direction, forming thereon a plurality of second conducting lines in a second direction, wherein said second conducting lines comprises a polysilicon layer, forming thereon a tungsten silicide ($WSi_x$) layer, comprising steps of:

forming a dielectric layer over said first conducting lines and between any two of said second conducting lines;

forming a photoresist layer over said first and said second conducting lines;

forming a window on said photoresist layer to expose a portion of said second conducting lines;

thinning said portion of said second conducting lines in said window by reactive ion etching, wherein said etching is stopped when an exposed portion of said $WSi_x$ layer is etched out; and doping impurities into said substrate between two of said first conducting lines for a threshold voltage adjustment to form said memory cell.

21. A method for manufacturing a memory cell having a substrate, forming thereon a plurality of first conducting lines in a first direction, forming thereon a plurality of second conducting lines in a second direction, wherein said second conducting lines comprises a polysilicon layer, forming thereon a tungsten silicide ($WSi_x$) layer, comprising steps of:

forming a dielectric layer over said first conducting lines and between any two of said second conducting lines;

forming a photoresist layer over said first and said second conducting lines;

forming a window on said photoresist layer to expose a portion of said second conducting lines;

thinning said portion of said second conducting lines in said window by reactive ion etching, wherein said etching is stopped when a remained portion of said polysilicon layer has a thickness range from 500 Å to 1000 Å; and doping impurities into said substrate between two of said first conducting lines for a threshold voltage adjustment to form said memory cell.

\* \* \* \* \*